(12) United States Patent
Brick et al.

(10) Patent No.: US 11,233,373 B2
(45) Date of Patent: Jan. 25, 2022

(54) RADIATION-EMITTING SEMICONDUCTOR ARRANGEMENT AND DEVICE HAVING A RADIATION-EMITTING SEMICONDUCTOR ARRANGEMENT

(71) Applicant: OSRAM Opto Semiconductors GmbH, Regensburg (DE)

(72) Inventors: Peter Brick, Regensburg (DE); Hubert Halbritter, Dietfurt (DE)

(73) Assignee: OSRAM OLED GmbH, Regensburg (DE)

( * ) Notice: Subject to any disclaimer, the term of this patent is extended or adjusted under 35 U.S.C. 154(b) by 203 days.

(21) Appl. No.: 16/480,071

(22) PCT Filed: Jan. 18, 2018

(86) PCT No.: PCT/EP2018/051174
§ 371 (c)(1),
(2) Date: Jul. 23, 2019

(87) PCT Pub. No.: WO2018/137990
PCT Pub. Date: Aug. 2, 2018

(65) Prior Publication Data
US 2019/0386452 A1 Dec. 19, 2019

(30) Foreign Application Priority Data
Jan. 25, 2017 (DE) .................. 10 2017 101 363.6

(51) Int. Cl.
*H01S 5/00* (2006.01)
*G01J 3/10* (2006.01)
(Continued)

(52) U.S. Cl.
CPC .............. *H01S 5/0092* (2013.01); *G01J 3/10* (2013.01); *G01J 3/2803* (2013.01);
(Continued)

(58) Field of Classification Search
CPC ........... G01J 3/10; G01J 3/2803; H01S 5/005; H01S 5/0071; H01S 5/0078;
(Continued)

(56) References Cited

U.S. PATENT DOCUMENTS

2003/0006382 A1    1/2003  Spath et al.
2003/0210716 A1*  11/2003  Sakata .................. B82Y 20/00
                                                                                    372/22
(Continued)

FOREIGN PATENT DOCUMENTS

DE         199 63 805 B4    1/2005
DE    10 2012 214 219 A1    2/2014
(Continued)

OTHER PUBLICATIONS

Rosemann, N.W. et al. "A highly efficient directional molecular white-light emitter driven by a continuous-wave laser diode", *Science*, 352(6291): pp. 1301-1304, Jun. 10, 2016. https://science.sciencemag.org/content/352/6291/1301.
(Continued)

*Primary Examiner* — Sunghee Y Gray
(74) *Attorney, Agent, or Firm* — DLA Piper LLP (US)

(57) ABSTRACT

A radiation-emitting semiconductor arrangement includes at least one semiconductor body having an active region that generates a primary radiation, and includes a radiation conversion element, wherein the radiation conversion element converts the primary radiation at least partially into a secondary radiation during operation of the semiconductor arrangement, the radiation conversion element emits the secondary radiation at a narrow angle, the radiation conversion element emits the secondary radiation into a projected spatial angle of not more than π/5, and the semiconductor arrangement includes an optical deflector movable during operation of the semiconductor arrangement.

16 Claims, 7 Drawing Sheets

(51) Int. Cl.
*G01J 3/28* (2006.01)
*H01S 5/40* (2006.01)
*H01S 5/42* (2006.01)

(52) U.S. Cl.
CPC .......... *H01S 5/0071* (2013.01); *H01S 5/0078* (2013.01); *H01S 5/4031* (2013.01); *H01S 5/423* (2013.01); *H01S 5/005* (2013.01)

(58) Field of Classification Search
CPC .... H01S 5/0092; H01S 5/4012; H01S 5/4031; H01S 5/423; H04N 5/2256
USPC ......................................................... 356/326
See application file for complete search history.

(56) References Cited

U.S. PATENT DOCUMENTS

| | | | | |
|---|---|---|---|---|
| 2010/0165307 A1* | 7/2010 | Mizushima | .......... | G02B 26/105 353/98 |
| 2012/0199748 A1* | 8/2012 | Cooke | .................. | G01T 1/2002 250/363.03 |
| 2013/0207145 A1* | 8/2013 | Schneider | ............... | H01L 33/60 257/98 |
| 2018/0120157 A1 | 5/2018 | Kaufmann et al. | | |
| 2019/0280169 A1* | 9/2019 | Pust | ....................... | C09K 11/57 |

FOREIGN PATENT DOCUMENTS

| | | | | |
|---|---|---|---|---|
| DE | 10 2015 106 635 A1 | 11/2016 | | |
| WO | WO-2016166005 A1 * | 10/2016 | ............. | H01L 33/44 |
| WO | WO-2018138370 A1 * | 8/2018 | ........... | H01L 33/504 |

OTHER PUBLICATIONS

Stephens, R.R. et al. "Diode-pumped upconversion laser with 100-mW output power", *Optics Letters*, Optical Society of America, 18(1): p. 34-36, Jan. 1, 1993. https://www.osapublishing.org/ol/abstract.cfm?uri=ol-18-1-34.

Powell, R.C. *Physics of Solid-State Laser Materials*. pp. 344-345, 372-377, New York: Springer, 1998.

* cited by examiner

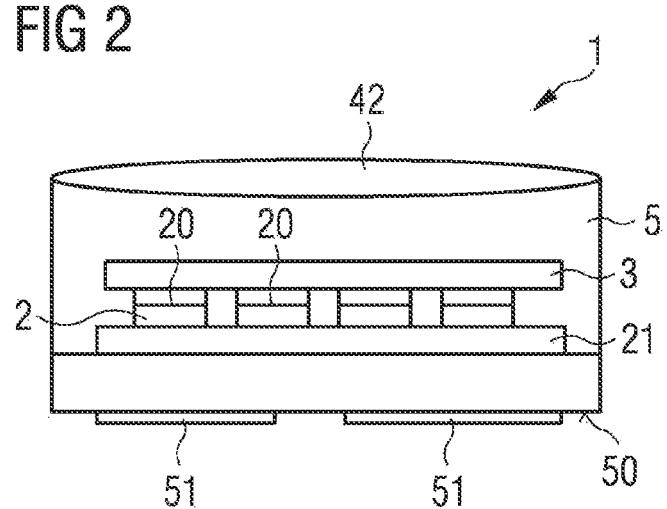
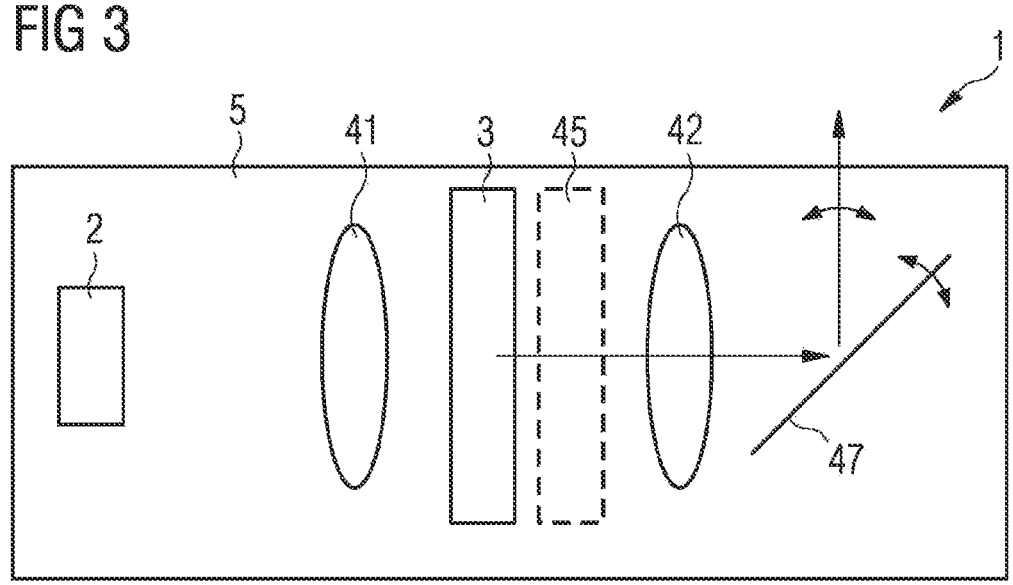

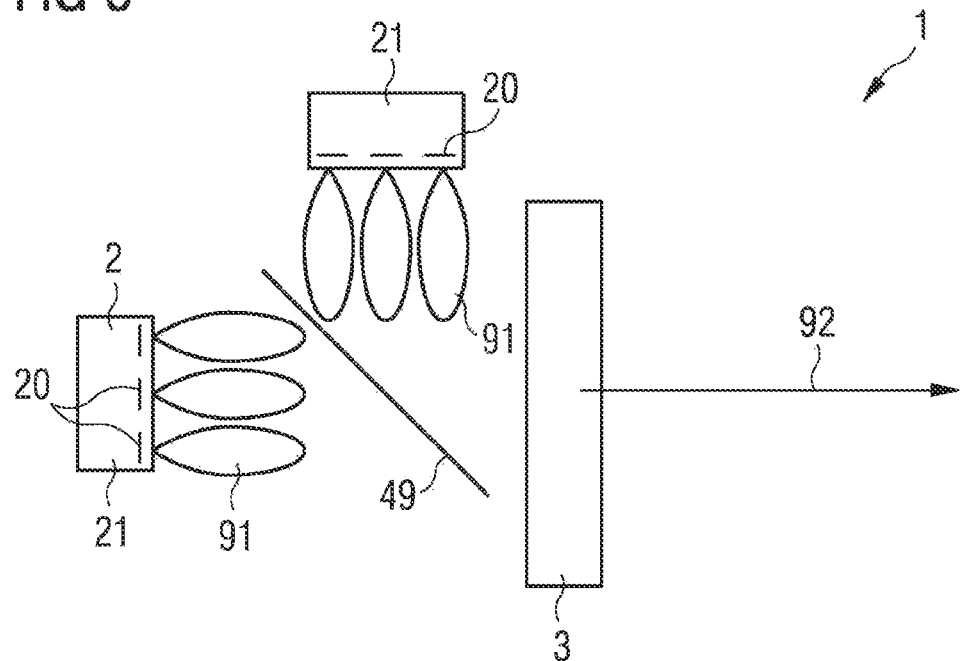
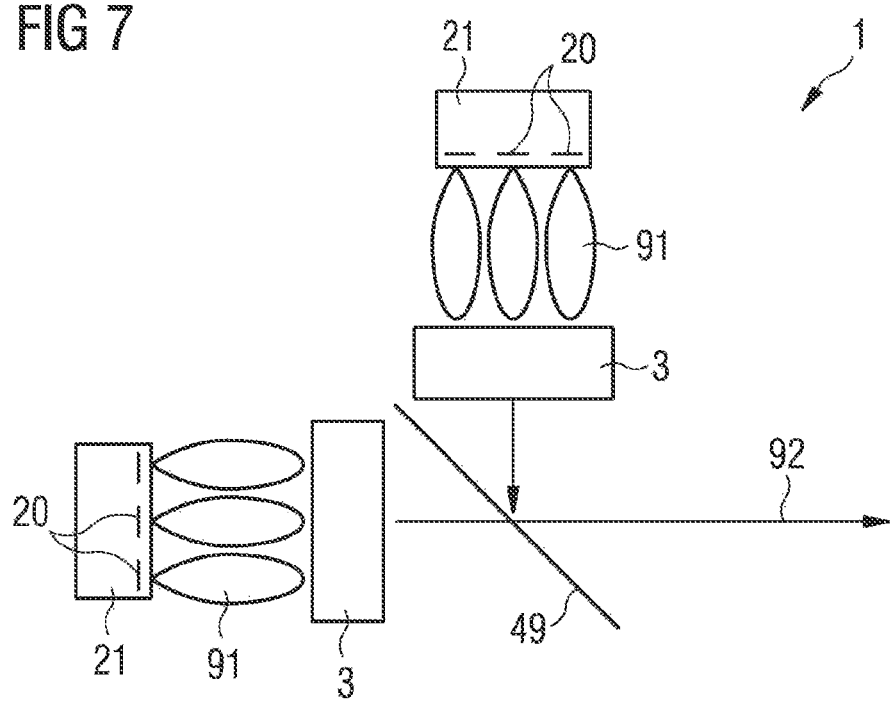

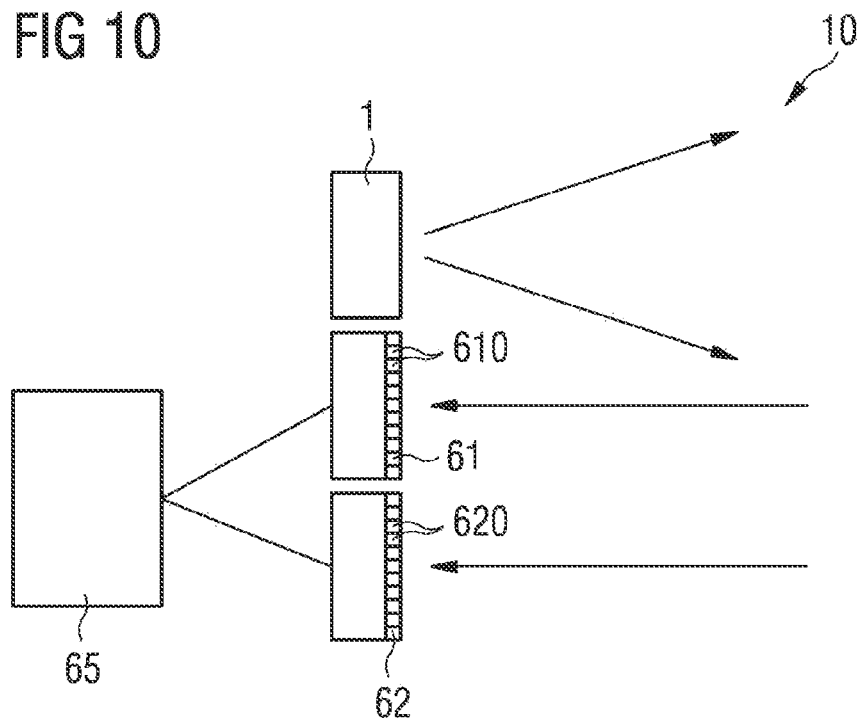
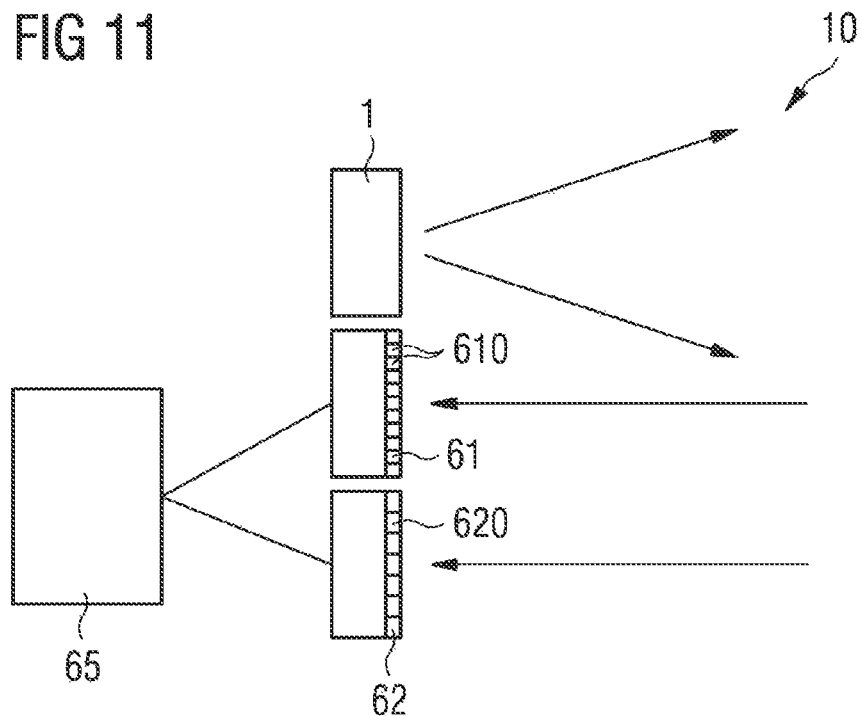

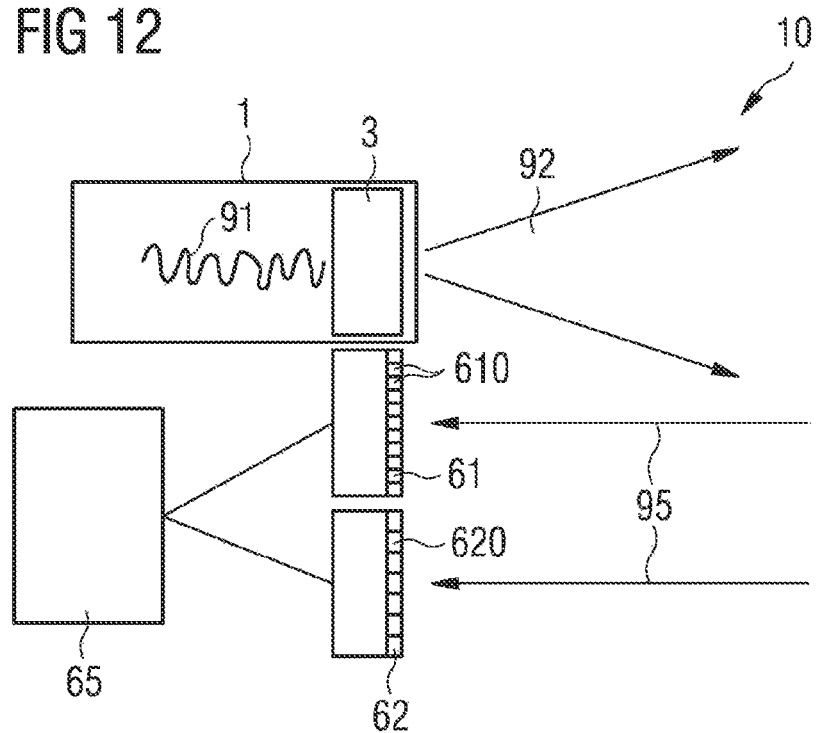

RADIATION-EMITTING SEMICONDUCTOR ARRANGEMENT AND DEVICE HAVING A RADIATION-EMITTING SEMICONDUCTOR ARRANGEMENT

TECHNICAL FIELD

This disclosure relates to a radiation-emitting semiconductor arrangement and a device comprising a radiation-emitting semiconductor arrangement.

BACKGROUND

To generate mixed light that appears white to the human eye, light-emitting diodes or lasers in combination with a radiation converter can be used in the blue spectral range. However, this results in an emission similar to a Lambertian surface radiator and thus a comparatively large etendue.

It could therefore be helpful to provide a semiconductor arrangement characterized by a directed emission, especially in spectrally wide radiation.

SUMMARY

We provide a radiation-emitting semiconductor arrangement including at least one semiconductor body having an active region that generates a primary radiation, and including a radiation conversion element, wherein the radiation conversion element converts the primary radiation at least partially into a secondary radiation during operation of the semiconductor arrangement, the radiation conversion element emits the secondary radiation at a narrow angle, the radiation conversion element emits the secondary radiation into a projected spatial angle of not more than $\pi/5$, and the semiconductor arrangement includes an optical deflector movable during operation of the semiconductor arrangement.

We also provide a device including the semiconductor arrangement including at least one semiconductor body having an active region that generates a primary radiation, and including a radiation conversion element, wherein the radiation conversion element converts the primary radiation at least partially into a secondary radiation during operation of the semiconductor arrangement, the radiation conversion element emits the secondary radiation at a narrow angle, the radiation conversion element emits the secondary radiation into a projected spatial angle of not more than $\pi/5$, and the semiconductor arrangement includes an optical deflector movable during operation of the semiconductor arrangement and a spectrometer on which at least part of the secondary radiation impinges during operation of the device.

We further provide a device including the semiconductor component including at least one semiconductor body having an active region that generates a primary radiation, and including a radiation conversion element, wherein the radiation conversion element converts the primary radiation at least partially into a secondary radiation during operation of the semiconductor arrangement, the radiation conversion element emits the secondary radiation at a narrow angle, the radiation conversion element emits the secondary radiation into a projected spatial angle of not more than $\pi/5$, and the semiconductor arrangement includes an optical deflector movable during operation of the semiconductor arrangement, a first radiation receiver having a plurality of first pixels, and a second radiation receiver having a plurality of second pixels.

We still further provide a radiation-emitting semiconductor arrangement including at least one semiconductor body having an active region that generates a primary radiation, and a radiation conversion element, wherein the radiation conversion element converts the primary radiation at least partially into a secondary radiation during operation of the semiconductor arrangement, and the radiation conversion element emits the secondary radiation at a narrow angle.

BRIEF DESCRIPTION OF THE DRAWINGS

FIGS. 2, 3, 4, 5, 6, 7, 8 and 9 each show an example of a semiconductor arrangement.

FIGS. 10, 11 and 12 each show an example of a device comprising a semiconductor arrangement.

Figure 1A:
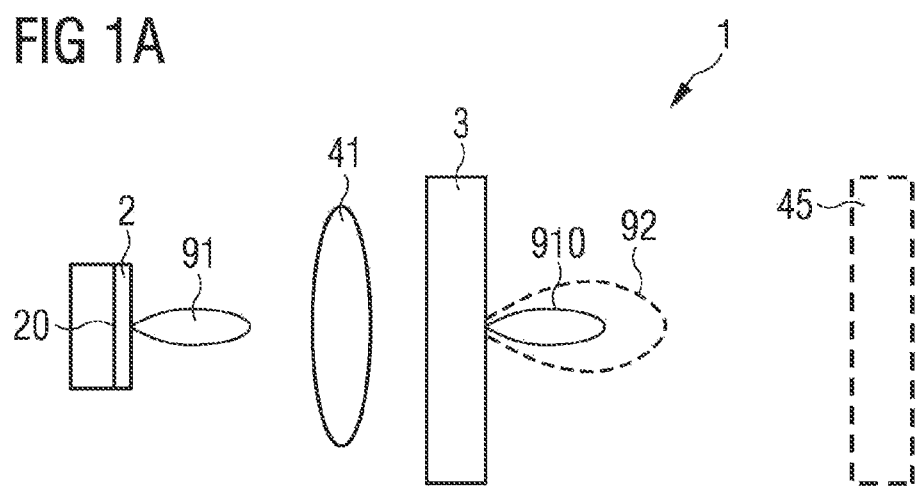
FIG. 1A shows an example of a semiconductor arrangement in a schematic representation.

LIST OF REFERENCE SIGNS 1 semiconductor arrangement
10 device
2 semiconductor body
20 active region
21 semiconductor component
3 radiation conversion element
31 segment
41 first optical element
42 second optical element
45 filter element
47 optical deflector
49 optical superimposer
5 housing
50 mounting surface
51 contact
55 carrier
61 first radiation receiver
610 first pixel
62 second radiation receiver
620 second pixel
63 spectrometer
65 evaluation unit
91 primary radiation
910 transmitted primary radiation
92 secondary radiation
95 incident radiation
99 object

DETAILED DESCRIPTION

We provide a radiation-emitting semiconductor arrangement. In particular, the radiation emitted by the semiconductor arrangement during operation is not completely coherent. For example, at least 50% or at least 90% of the emitted radiation components are incoherent with respect to their intensity.

The radiation-emitting semiconductor arrangement may comprise at least one semiconductor body having an active region provided to generate primary radiation. The semiconductor body may be designed to generate incoherent, coherent or partially coherent radiation. For example, the semiconductor body is a semiconductor laser such as a surface-emitting semiconductor laser or an edge-emitting semiconductor laser, a superluminescent diode or a light-emitting diode.

The semiconductor body is intended, for example, to generate radiation in the infrared spectral range, for instance with a peak wavelength of 780 nm to 980 nm.

However, the peak wavelength can also be smaller than 780 nm, for example, at least 700 nm or more.

The semiconductor arrangement may comprise a radiation conversion element, the radiation conversion element intended to convert the primary radiation at least partially into a secondary radiation during operation of the semiconductor arrangement. For example, the secondary radiation lies in the visible spectral range or in the infrared spectral range. In particular, the radiation conversion element is not located in a resonator.

The radiation conversion element may emit the secondary radiation at a narrow angle. This means that the radiation conversion element itself, i.e. even without an optical element arranged downstream thereof, radiates at a narrow angle, in particular due to the physical process on which radiation conversion is based. A narrow-angled radiation is a radiation that radiates into a smaller projected spatial angle than a Lambertian surface radiator. A Lambertian surface radiator radiates into a half-space so that the projected spatial angle is $\pi$. For example, the radiation conversion element radiates into a projected spatial angle of not more than $\pi/2$.

We found that a radiation conversion element is particularly suitable where the primary radiation causes a radiation conversion into secondary radiation in the conversion element, based on a non-linear optical process.

A non-linear optical process is generally understood to be a process in which the incident electric field of the primary radiation causes, in the radiation conversion element, a polarization that is no longer purely linear to the electric field.

For example, materials whose electronic ground state has an anharmonic potential are suitable. Driven by an electric field, higher harmonics can be generated. For example, N. W. Rosemann in Science, Vol. 352, Iss. 6291, 1301-1304 (2016) describes a highly efficient molecular white light emitter. The entire disclosure content of Rosemann is explicitly incorporated herein by reference.

Alternatively or in addition, a non-linear optical process can be used which leads to an up-conversion of the excitating primary radiation. Such processes include, for example, two-photon absorption, cross-relaxation energy transfer or avalanche absorption. A two-photon absorption includes in particular an absorption via a virtual intermediate state, an absorption via a resonant intermediate state or an absorption via a non-resonant intermediate state.

Such non-linear optical processes are described in connection with materials for solid-state lasers in "Physics of solid-state laser materials" by R. C. Powell, ISBN 1-56396-658-1. In this regard, the entire disclosure content of Powell is explicitly incorporated herein by reference. We found that such processes are also suitable for a semiconductor arrangement that, in contrast to lasers, does not aim at a radiation that is as purely coherent as possible.

After such an up-conversion, the radiation conversion element can emit radiation of a wavelength shorter than the radiation of the excitation radiation (primary radiation) by spontaneous or stimulated emission.

The radiation-emitting semiconductor arrangement may comprise at least one semiconductor body having an active region that generates primary radiation. Furthermore, the semiconductor arrangement may comprise a radiation conversion element that at least partially converts the primary radiation into a secondary radiation during operation of the semiconductor arrangement and emits the secondary radiation at a narrow angle.

We found that in this way a semiconductor arrangement can be realized which, for example, can produce radiation that appears white to the human eye in a spectrally broadband manner and with a low etendue. Due to the low etendue, the radiation emitted by the semiconductor arrangement can be further processed in a simplified way. For example, a highly efficient illumination of a field of view can be realized with a particularly compact design of the semiconductor arrangement. In addition, this results in improved cost efficiency since highly efficient illumination of the field of view can be achieved with smaller light sources and optical elements.

Furthermore, the semiconductor body can be designed as a semiconductor laser emitting in the infrared spectral range, for example. These semiconductor lasers are characterized by their high efficiency so that in combination with the narrow-angled radiating conversion element a highly efficient radiation source is obtained, which emits white radiation in a more directed manner than a Lambertian surface radiator.

The radiation conversion element may emit the secondary radiation into a projected spatial angle of not more than $\pi/5$. The emitted radiation is therefore narrow-angled to an increased degree and characterized by simplified further processability, for example, by an optical system arranged downstream in the beam path.

A full half-width of the secondary radiation shall be at least 100 nm, for example, at least 200 nm or at least 300 nm. The larger the half-width of the secondary radiation, the more radiation components with different wavelengths are contained in the secondary radiation to a significant extent.

The semiconductor arrangement may comprise a first optical element arranged between the active region and the radiation conversion element. The first optical element is intended in particular to bundle and, in particular, focus the primary radiation emitted from the active region into the material of the radiation conversion element. This allows higher local power densities to be achieved in the material of the radiation conversion element. This increases the efficiency of non-linear optical processes.

The semiconductor arrangement may comprise a second optical element, the radiation conversion element being arranged in the beam path between the active region and the second optical element. The second optical element is intended in particular to influence the secondary radiation emitted by the radiation conversion element and, if necessary, also the primary radiation transmitted by the radiation conversion element in accordance with a predetermined radiation characteristic, for example, to bundle, collimate or expand it.

The terms first optical element and second optical element serve only for a simplified differentiation of these elements. The term second optical element, however, does not imply that a first optical element necessarily exists. Rather, the second optical element may also be the only optical element of the radiation-emitting semiconductor arrangement. Of course, the first optical element can also be the only optical element of the radiation-emitting semiconductor arrangement.

In particular, the first optical element and/or the second optical element may comprise or consist of a diffractive optical element, a refractive optical element or a reflective optical element.

The secondary radiation may comprise wavelengths smaller than the wavelengths of the primary radiation. For example, the primary radiation lies in the infrared spectral range and at least part of the secondary radiation in the visible spectral range. Alternatively, both the primary radiation and the secondary radiation can lie in the infrared spectral range or in the visible spectral range.

The semiconductor arrangement may comprise a plurality of active regions that generate radiation. For example, their radiation impinges on each radiation conversion element. The intensity of the primary radiation can be increased by increasing the number of active regions. For example, the radiation emitted by two active regions can be superimposed on the radiation conversion element. Furthermore, at least two active regions can also emit mutually different primary radiations, e.g. different with regard to their peak wavelength.

At least two of the active regions may be integrated in a semiconductor component. For example, the semiconductor component is a one-dimensional or two-dimensional array of edge-emitting lasers or a one-dimensional or two-dimensional array of surface-emitting lasers. With surface-emitting lasers, a particularly high beam quality can be achieved. Furthermore, a matrix-shaped two-dimensional arrangement of active regions is simplified by a surface-emitting laser and can be achieved in a particularly compact way. Higher radiation intensities can typically be achieved with edge-emitting semiconductor lasers.

At least two of the active regions may be formed in separate semiconductor components. For example, the radiation emitted by the semiconductor components is superimposed on the radiation conversion element, for example, by a beam splitter.

A filter element that at least partially blocks the primary radiation may be arranged downstream of the radiation conversion element in the radiation direction. For example, the filter element is designed such that it largely blocks radiation in one spectral range, for example, in the infrared spectral range, and largely transmits radiation in a second spectral range. "Largely blocks" means that the transmission is at most 30%. "Largely transmits" means accordingly that the transmission is at least 70%. For example, the filter element reflects at least part of the primary radiation back in the direction of the radiation conversion element and lets the secondary radiation pass through. The filter element may also have a transmission of not more than 5% or not more than 1% in a spectral range, for example, for the peak wavelength of the primary radiation.

The semiconductor arrangement may comprise an optical deflector that is movable during operation of the semiconductor arrangement. For example, the optical deflector is a micro(opto)electromechanical system (MOEMS or MEMS). During operation of the semiconductor arrangement, emission of the semiconductor arrangement can be controlled by the movable optical deflector.

The movable optical deflector may be arranged in a beam path between the active region and the radiation conversion element. The position at which the primary radiation impinges on the radiation conversion element can in particular be adjusted by the movable optical deflector. For example, the primary radiation is rastered over the radiation conversion element by the movable optical deflector to avoid fading of the radiation conversion element or damage or aging due to excessive exposure to high radiation intensities.

Furthermore, the radiation conversion element may comprise at least two segments that generate secondary radiation with different peak wavelengths. By the movable optical deflector, for example, it is possible to adjust on which segment the primary radiation impinges. In this example, the color location of the radiation emitted by the semiconductor arrangement can be adjusted by the movable optical deflector.

For example, a focal point of the second optical element lies in a deflection plane of the movable optical deflector. By the second optical element, a change in the emission direction of the secondary radiation due to the movable optical deflector can thus be compensated completely or at least partially.

The radiation conversion element may be arranged in a beam path between the active region and the movable optical deflector. The movable optical deflector therefore deflects the secondary radiation and, if necessary, also the primary radiation passing through the radiation conversion element.

The active region may emit coherent or partially coherent primary radiation in the infrared spectral range during operation of the semiconductor arrangement. The primary radiation causes a radiation conversion into secondary radiation in the radiation conversion element, based on a nonlinear optical process. The secondary radiation has a full half-width of at least 100 nm and the secondary radiation comprises wavelengths that are smaller than the wavelength of the primary radiation. The radiation conversion element emits the secondary radiation into a projected spatial angle of not more than $\pi/5$.

Such a semiconductor arrangement represents a spectrally broadband radiation source, for example, a white light source that emits radiation in a directed manner and, due to the primary light lying in the infrared spectral range, can also exhibit particularly high efficiency and, at the same time, a compact design.

We further provide a device comprising a semiconductor arrangement, the semiconductor arrangement having at least one of the aforementioned features.

The device may comprise a semiconductor arrangement and a spectrometer on which at least part of the secondary radiation impinges during operation of the device. In particular, the semiconductor arrangement and the spectrometer are integrated into a common device and arranged in a common housing, for example. The spectrometer is intended, for example, to detect properties of a medium interacting with the radiation of the semiconductor arrangement such as a gas or a solid by a spectral analysis.

The arrangement may comprise a semiconductor component, a first radiation receiver having a plurality of first pixels and a second radiation receiver having a plurality of second pixels. The first radiation receiver and the second radiation receiver are intended in particular for radiation detection in different spectral ranges. For example, the first radiation receiver includes pixels sensitive in the red, green and blue spectral ranges.

The first radiation receiver may be sensitive in the visible spectral range and the second radiation receiver may be sensitive in the infrared spectral range. For example, the second radiation receiver detects a part of the primary radiation and/or a part of the secondary radiation. By the second radiation receiver, information can be obtained that goes beyond the information in the visible spectral range.

The semiconductor arrangement may have a specifically reduced intensity in a sensitivity range of the human eye and the device may comprise an evaluation unit that compensates for a signal reduced in the sensitivity range by the first radiation receiver by a signal from the second radiation receiver. For example, the semiconductor arrangement emits a reduced amount of radiation at the maximum sensitivity of the human eye, for example, in the green spectral range. When such a semiconductor arrangement is used as a flash light, a glare effect of the human eye is reduced in this way. Negative influences of the image quality of the information recorded by the first radiation receiver can be compensated for by the additional signal in the infrared spectral range.

The second radiation receiver may be provided to measure the propagation time of the primary radiation and/or secondary radiation emitted by the semiconductor arrangement. Based on the information obtained by the propagation time measurement, the pixels of the first radiation receiver can be assigned information about the distance of the recorded scene. This allows creation of three-dimensional images of a scene.

Further functionalities can be gathered from the following description of examples in connection with the figures.

Identical, similar or identically acting elements are provided with the same reference signs in the figures.

The figures are schematic representations and therefore not necessarily true to scale. Rather, comparatively small elements and, in particular, layer thicknesses can be represented exaggeratedly large for illustration purposes.

FIG. 1A schematically shows a functional principle of the semiconductor arrangement 1. The semiconductor arrangement 1 comprises a semiconductor body 2 having an active region 20 that generates a primary radiation 91.

The semiconductor arrangement further comprises a radiation conversion element 3 that converts at least part of the primary radiation 91 into a secondary radiation 92 during operation of the semiconductor arrangement and emits the secondary radiation at a narrow angle.

The radiation characteristic is shown schematically in FIG. 1A on the basis of emission lobes. In contrast to a Lambertian surface radiation, emission of the secondary radiation in a section through the three-dimensional emission lobe does not extend into a projected spatial angle of $\pi$, but is narrow-angled compared to the latter. For example, the secondary radiation radiates into a projected spatial angle of not more than $\pi/5$.

A first optical element 41 is optionally arranged between the semiconductor body 2 and the radiation conversion element 3. The first optical element 41 in particular locally increases the power density of the primary radiation in the radiation conversion element 3. A diffractive optical element such as a diffraction grating or a Fresnel zone plate is particularly suitable for use as the first optical element since the primary radiation 91 is typically a comparatively narrow-band radiation and efficient beam shaping can be achieved by a diffractive element in a particularly space-saving manner. Alternatively or in addition, however, the first optical element may also have a refractive optical element such as a lens, or a reflective optical element such as a curved mirror.

A filter element 45 is optionally arranged downstream of the radiation conversion element 3 as seen in the radiation direction of the semiconductor body 2. The filter element 45 in particular at least partially blocks the primary radiation 910 transmitted by the radiation conversion element. For example, the filter element 45 is largely reflective for the primary radiation and largely transmissive for the secondary radiation 92.

Figure 1B:
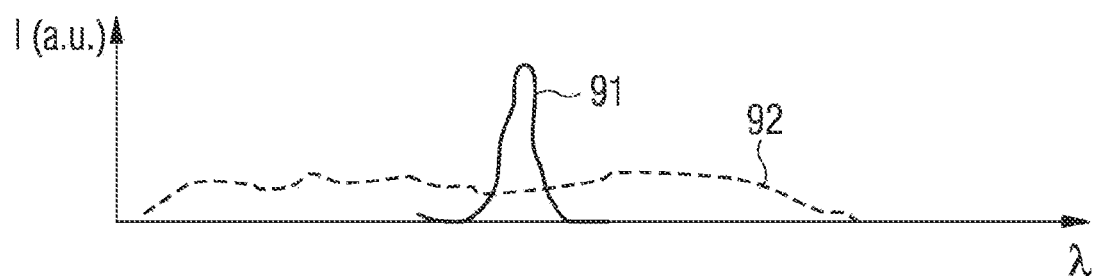
FIG. 1B shows a schematic representation of a course of the intensity I of a primary radiation and a secondary radiation in arbitrary units (a.u.) depending on the wavelength $\lambda$.

Emission spectra for the primary radiation 91 and the secondary radiation 92 are schematically shown in FIG. 1B in arbitrary units depending on the wavelength $\lambda$. The secondary radiation 92 is in particular spectrally broadband compared to the primary radiation. For example, a full half-width of the secondary radiation is at least 100 nm or at least 200 nm or at least 300 nm. For example, the full half-width of the secondary radiation is at least twice, at least three times or at least five times as large as a full half-width of the primary radiation.

In the example shown, the secondary radiation 92 has wavelengths that are larger than the wavelengths of the primary radiation 91 and wavelengths that are smaller than the wavelengths of the primary radiation.

However, the wavelengths of the secondary radiation 92 can also be completely smaller than the wavelengths of the primary radiation 91. For example, the primary radiation 91 lies in the infrared spectral range and the secondary radiation at least predominantly, i.e. with a proportion of at least 60%, in the visible spectral range.

As a material for the radiation conversion element 3, a material is particularly suitable in which the primary radiation causes a radiation conversion in the radiation conversion element, based on a non-linear optical process.

For example, the radiation conversion material has semiconductor-based cluster molecules provided with covalently bonded organic ligands. These organic ligands can provide delocalized electron states.

For example, the molecules are based on tin sulfide with a diamond-like structure (diamondoids). Due to their tetrahedral structure, these have no inversion symmetry. For example, the organic ligands R have the structure R=4-$(CH_2=CH)-C_6H_4$.

For example, this material exhibits a broad emission spectrum in the visible spectral range when excited at a wavelength of 980 nm. In an excitation wavelength range from 725 nm to 1050 nm, the spectral distribution of the white light produced is largely the same.

In principle, however, all materials are suitable in which non-linear optical processes, in particular the processes mentioned in the general part of the description such as up-conversion occur with high efficiency.

For example, the peak wavelength of the primary radiation 91 is 780 nm to 980 nm.

A peak wavelength of the secondary radiation 92 is 400 nm to 800 nm, for example.

Depending on the application, the secondary radiation 92 may also be in the infrared spectral range, for example, of 700 nm to 1100 nm or 700 nm to 1600 nm. Furthermore, the peak wavelength of the primary radiation 91 can also be smaller than the peak wavelength of the particularly broadband secondary radiation. For example, the peak wavelength of the primary radiation can be 660 nm and the secondary radiation can be broadband radiation with a lower cut-off wavelength of 700 nm.

The semiconductor arrangement 1 thus provides a spectrally broadband light source that is additionally characterized by a low etendue. This simplifies further processing of the radiation emitted by the radiation-emitting semiconductor arrangement.

FIG. 2 shows a schematic cross section of an example of a radiation-emitting semiconductor arrangement. The semiconductor body 2 is part of a semiconductor component 21 having a plurality of active regions 20. For example, the semiconductor component 21 is a one-dimensional or two-dimensional array of surface-emitting semiconductor lasers (VCSEL, Vertical Cavity Surface Emitting Laser).

The radiation conversion element 3, for example, rests on the semiconductor component 21 in the form of a platelet. For example, the radiation conversion element 3 covers several active regions 20.

For example, the semiconductor arrangement 1 is designed as a surface-mounted device (SMD). A housing 5 of the semiconductor arrangement 1 has contacts 51 on a mounting surface 50 provided for external electrical contacting of the semiconductor arrangement. The radiation emitted during operation by the semiconductor arrangement 1 exits at the side opposite the mounting surface 50, for example.

A second optical element 42 is arranged downstream of the radiation conversion element 3 in the radiation direction. The second optical element 42 shapes the beam of the secondary radiation and, if necessary, the primary radiation passing through the radiation conversion element 3.

Of course, a first optical element and/or a filter element can also be additionally provided in this example as described in connection with FIG. 1A. Furthermore, the second optical element 42 is also suitable for the other examples unless explicitly stated otherwise.

In the other examples, as well, the semiconductor arrangement 1 can have a housing that closes off the semiconductor arrangement from the environment, and in particular be designed as a surface-mountable component.

The example shown in FIG. 3 essentially corresponds to the example described in connection with FIG. 1A.

In contrast to the latter, the semiconductor arrangement 1 comprises an optical deflector 47. The optical deflector is movable and designed to deflect the secondary radiation and, if necessary, the primary radiation by a temporally variable angle during operation of the semiconductor arrangement. For example, the optical deflector is a micro (opto)electromechanical system.

For example, the semiconductor body 2 is part of a semiconductor component having a single emitter such as an edge-emitting semiconductor laser.

The first optical element 41, the second optical element 42 and the filter element 45 are each optional.

The example shown in FIG. 4 essentially corresponds to the example described in connection with FIG. 3. In contrast to the latter, the optical deflector 47 is arranged in the beam path between the semiconductor body 2 and the radiation conversion element 3. The position at which the primary radiation of the semiconductor body 2 impinges on the radiation conversion element 3 can be adjusted during operation of the semiconductor arrangement 1 by the optical deflector 47. Effects that reduce the conversion efficiency in the radiation conversion material such as fading or quenching, can thus be prevented or at least reduced.

Optionally, a second optical element 42 and/or a filter element 45 can be arranged downstream of the radiation conversion element 3. For example, a deflection plane of the optical deflector 47 is located at the focal point of the second optical element 42. A change in the position of the impingement point of the primary radiation on the radiation conversion element thus causes no or at least only a negligible change in the spatial radiation characteristic of the semiconductor arrangement 1 after passing through the second optical element 42.

For example, the optical deflector 47 and the semiconductor body 2 are arranged on a common carrier 55.

The example shown in FIG. 5 essentially corresponds to the example described in connection with FIG. 4. In contrast to the latter, the radiation conversion element 3 has a plurality of segments 31. For example, the segments 31 differ in the peak wavelength, by about 10 nm or more, and/or the spectral width, by about 10 nm or more in the full half-width, of the secondary radiation emitted by the respective segments 31.

The spectral radiation characteristic of the semiconductor arrangement 1 can thus be adjusted by the optical deflector 47 during operation of the semiconductor arrangement 1.

Figure 4:
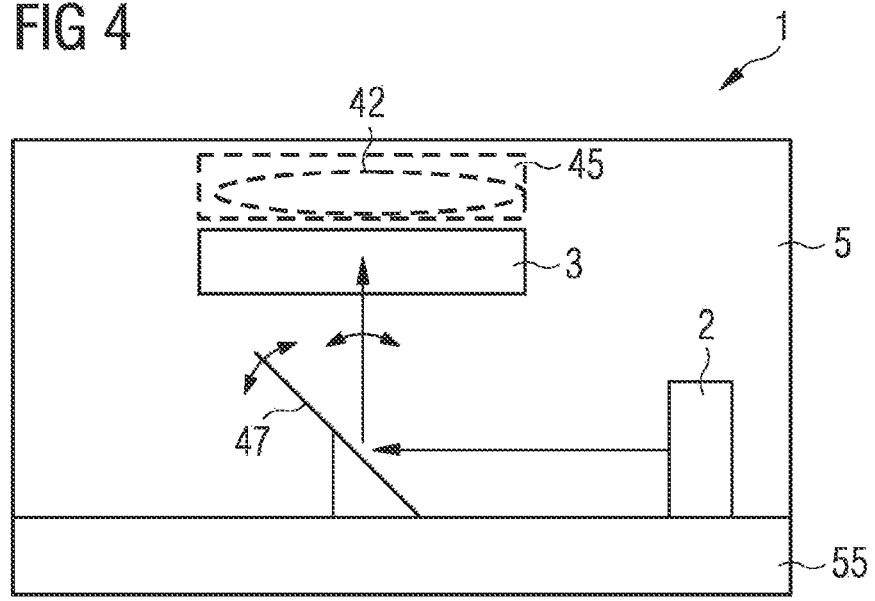
Figure 5:
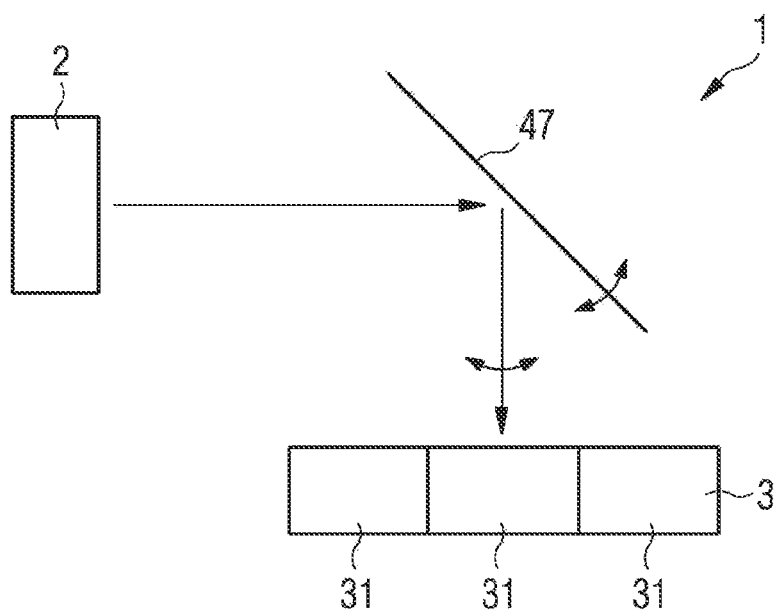

The structural features of the semiconductor arrangement 1 further described in FIG. 4 are also applicable to this example.

FIG. 6 shows another example of a semiconductor arrangement 1. This essentially corresponds to the example described in connection with FIG. 1A. In contrast to the latter, the semiconductor arrangement 1 comprises a plurality of semiconductor components 21. In the example shown, the semiconductor components 21 each have a plurality of active regions 20. The primary radiation emitted by the semiconductor components 21 is superimposed on the radiation conversion element 3 by an optical superimposer 49 such as a beam splitter. The power density on the radiation conversion element 3 can be increased by superimposing the primary radiation emitted by several semiconductor components 21. Due to the non-linear optical processes occurring in the radiation conversion element 3, an increased power density in the radiation conversion element leads to an increased radiation conversion efficiency at least for power densities that are significantly lower than the damage threshold of the radiation conversion element.

The active regions 20 of the individual semiconductor components 21 can also differ from each other in terms of the peak wavelength of the primary radiation, for example, by at least 10 nm.

The example shown in FIG. 7 essentially corresponds to the example described in connection with FIG. 6.

In contrast to the latter, at least two semiconductor components 21 are each assigned a radiation conversion element 3. The optical superimposer 49 is arranged downstream of the radiation conversion elements 3 in the radiation direction. This design allows a higher luminance of the emitted radiation to be achieved without increasing the luminance at the position of the radiation conversion elements 3. Such a design is particularly suitable if an increase in luminance in the radiation conversion element 3 does no longer cause a significant increase in the intensity of the secondary radiation or if the material of the radiation conversion element 3 would age more rapidly. Furthermore, it is also possible to use radiation conversion elements 3 that differ from each other in terms of their spectral radiation characteristics.

Figure 8:
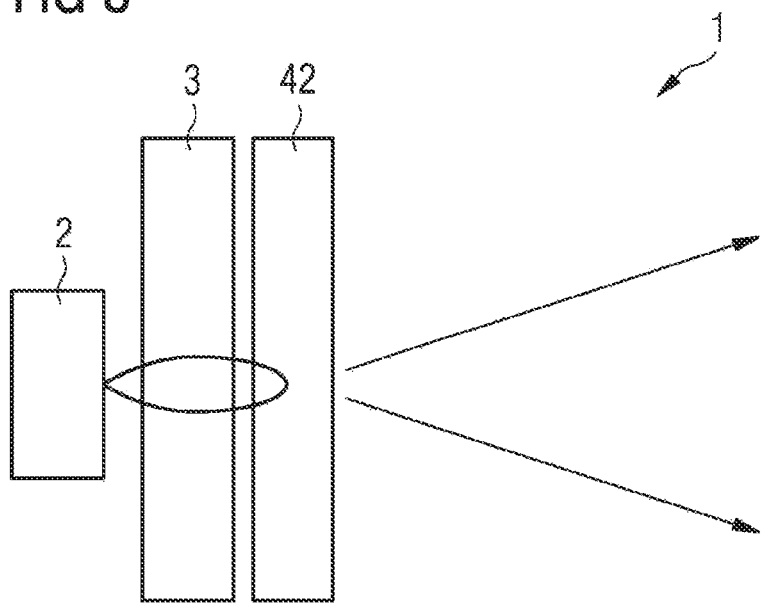

The example shown in FIG. 8 essentially corresponds to the example described in connection with FIG. 1A.

The semiconductor arrangement 1 is intended in particular to homogeneously illuminate a target area such as an area to be recorded by a camera of a mobile phone. The semiconductor arrangement 1 is preferably designed as a module that is particularly flat and has, for example, a thickness of not more than 2 mm or not more than 1 mm Such a semiconductor arrangement is also suitable, for example, for use in a game console or as a light source for a surveillance camera. A surface-emitting semiconductor laser or a semiconductor component with an array of surface-emitting semiconductor lasers is suitable for generating primary radiation, for example.

Figure 9:
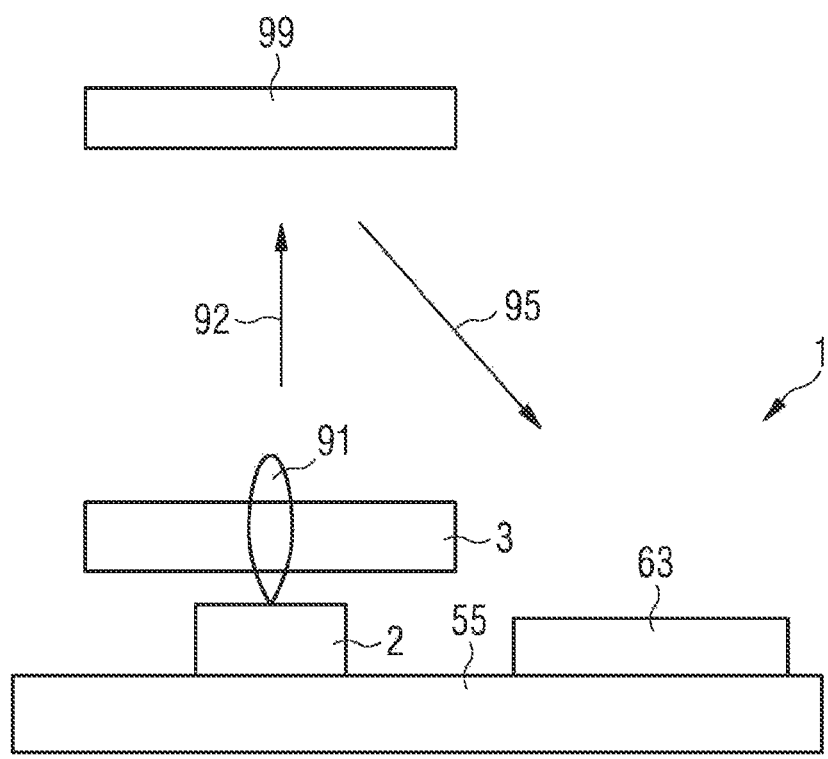

FIG. 9 shows another example of a semiconductor arrangement 1. This example essentially corresponds to the example described in connection with FIG. 1A. The semiconductor arrangement 1 additionally comprises a spectrometer 63. The spectrometer 63 spectrally analyzes an incident radiation 95. For example, the incident radiation 95 comes from an object 99 illuminated by the secondary radiation 92 and possibly also by the primary radiation 91. The semiconductor arrangement 1 is a compact module that can provide information about the object 99 on the basis of the detected spectrum of the incident radiation 95. For example, the object 99 is a food item whose freshness can be analyzed on the basis of the incident radiation 95. Alternatively, the object 99 can also be part of a human body, for example, a part of the skin. Furthermore, the object 99 to be analyzed can also be a gas. In this example, the spectrometer 63 does not analyze the radiation reflected by the object 99, but the radiation transmitted by the gas.

FIG. 10 shows an example of a device 10. The device 10 comprises a semiconductor arrangement 1 that can be designed in particular as described in connection with the previous examples. In particular, the semiconductor arrangement 1 is designed as a flat module that provides broadband radiation, for example, in the spectral range of 450 nm to 800 nm.

The device 10 further comprises a first radiation receiver 61 with a plurality of first pixels 610 and a second radiation receiver 62 with a plurality of second pixels 620.

The first radiation receiver 61 and the second radiation receiver 62 differ in their spectral sensitivity. For example, the first radiation receiver is intended for the visible spectral range and has for each spatial pixel a triple of pixels for the detection of radiation in the red, green and blue spectral range (RGB camera).

The second radiation receiver 62 is sensitive in the infrared spectral range, for example. Since, unlike in an RGB camera, no color filters are required, the second radiation receiver 62 can achieve a higher spatial resolution for the same size or a higher efficiency for the same spatial resolution due to a larger detection area per spatial pixel.

The signals of the first radiation receiver 61 and the second radiation receiver 62 can be fed to an evaluation unit 65, which, for example, has access to further information in the infrared spectral range in addition to the spectral information in the visible spectral range. This allows the resolution of the color images to be increased virtually.

The example shown in FIG. 11 essentially corresponds to the example described in connection with FIG. 10.

In contrast to the latter, the semiconductor arrangement 1 has a specifically reduced intensity in a sensitivity range of the human eye. When such a semiconductor arrangement 1 is used as a flash light, this causes a lower glare of the human eye. In the signal of the first radiation receiver 61, this would lead to an unwanted distortion of the recorded image. However, this can be compensated by the evaluation unit 65 by the signal determined by the second radiation receiver 62 so that the entire device represents a camera system with good color reproduction and an integrated glare-free flash. Such a device 10 may, for example, be used in a hand-held electronic device, for example, a communication device such as a mobile phone.

FIG. 12 shows another example of a device 10. This essentially corresponds to the example described in connection with FIG. 10. In contrast to the latter, the second radiation receiver 62 is intended for the spatially resolved determination of the propagation time of the secondary radiation and/or primary radiation emitted by the semiconductor arrangement. In conjunction with the signal of the first radiation receiver 61, the evaluation unit 65 can record three-dimensional color images. For the propagation time measurement, the semiconductor arrangement 1 expediently emits pulsed radiation. The second radiation receiver 62 can detect in particular the primary radiation emitted by the semiconductor arrangement. This method is particularly suitable if the decay times in the material of the radiation conversion element 3 are too long for an efficient determination of the propagation time. If the decay times are sufficiently short, for example, if the decay times are less than or equal to 10 ns, the secondary radiation can also be used to determine the propagation time.

This application claims priority of DE 10 2017 101 363.6, the subject matter of which is incorporated herein by reference.

Our arrangements and devices are not limited by the description of examples. Rather, this disclosure includes any new feature and any combination of features, which in particular includes any combination of features in the appended claims, even if that feature or combination itself is not explicitly mentioned in the claims or examples.

The invention claimed is:

1. A radiation-emitting semiconductor arrangement comprising at least one semiconductor body having an active region that generates a primary radiation, wherein the active region emits coherent or partially coherent primary radiation in an infrared spectral range during operation of the semiconductor arrangement, and a radiation conversion element, wherein the radiation conversion element converts the primary radiation at least partially into a secondary radiation during operation of the semiconductor arrangement, the radiation conversion element emits the secondary radiation at a narrow angle, the radiation conversion element emits the secondary radiation into a projected spatial angle of not more than $\pi/5$, the primary radiation causes a radiation conversion into secondary radiation in the radiation conversion element based on a non-linear optical process, the secondary radiation has a full half-width of at least 100 nm, and the secondary radiation comprises wavelengths which are smaller than the wavelengths of the primary radiation, and an optical deflector movable during operation of the semiconductor arrangement.

2. The radiation-emitting semiconductor arrangement according to claim 1, wherein a full half-width of the secondary radiation is at least 100 nm.

3. The radiation-emitting semiconductor arrangement according to claim 1, wherein the semiconductor arrangement comprises a first optical element arranged between the active region and the radiation conversion element.

4. The radiation-emitting semiconductor arrangement according to claim 1, wherein the semiconductor arrangement comprises a second optical element, the radiation conversion element arranged in a beam path between the active region and the second optical element.

5. The radiation-emitting semiconductor arrangement according to claim 1, wherein the secondary radiation comprises wavelengths smaller than the wavelengths of the primary radiation.

6. The radiation-emitting semiconductor arrangement according to claim 1, wherein the semiconductor arrangement comprises a plurality of active regions that generate radiation and whose radiation impinges on each radiation conversion element.

7. The radiation-emitting semiconductor arrangement according to claim 6, wherein at least two of the active regions are integrated in a semiconductor component.

8. The radiation-emitting semiconductor arrangement according to claim 6, wherein at least two of the active regions are formed in separate semiconductor components and the primary radiation emitted by each semiconductor components is superimposed on the radiation conversion element.

9. The radiation-emitting semiconductor arrangement according to claim 1, wherein a filter element that at least partially blocks the primary radiation is arranged downstream of the radiation conversion element in the radiation direction.

10. The radiation-emitting semiconductor arrangement according to claim 1, wherein the movable optical deflector is arranged in a beam path between the active region and the radiation conversion element.

11. The radiation-emitting semiconductor arrangement according to claim 1, wherein the radiation conversion element is arranged in a beam path between the active region and the movable optical deflector.

12. A device comprising the semiconductor arrangement according to claim 1 and a spectrometer on which at least part of the secondary radiation impinges during operation of the device.

13. A device comprising:
the semiconductor component according to claim 1;
a first radiation receiver having a plurality of first pixels; and
a second radiation receiver having a plurality of second pixels.

14. The device according to claim 13, wherein the first radiation receiver is sensitive in the visible spectral range and the second radiation receiver is sensitive in the infrared spectral range.

15. The device according to claim 14, wherein the semiconductor arrangement has a specifically reduced intensity in a sensitivity range of a human eye and the device has an evaluation unit that compensates for a signal reduced by the first radiation receiver in the sensitivity range by a signal from the second radiation receiver.

16. The device according to claim 13, wherein the second radiation receiver measures a propagation time of at least one of the primary radiation and secondary radiation emitted by the semiconductor arrangement.

* * * * *